United States Patent
Sasaki et al.

(10) Patent No.: US 8,164,318 B2
(45) Date of Patent: Apr. 24, 2012

(54) DIGITAL CONTROL SWITCHING POWER SUPPLY UNIT

(75) Inventors: Masahiro Sasaki, Matsumoto (JP); Tetsuya Kawashima, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 39 days.

(21) Appl. No.: 12/881,977

(22) Filed: Sep. 14, 2010

(65) Prior Publication Data

US 2011/0068965 A1 Mar. 24, 2011

(30) Foreign Application Priority Data

Sep. 14, 2009 (JP) ................................. 2009-212103

(51) Int. Cl.
*G05F 1/40* (2006.01)
(52) U.S. Cl. ........ 323/283; 323/222; 323/223; 323/262; 341/143; 341/144; 341/155; 341/157
(58) Field of Classification Search ................. 341/143, 341/144, 155, 190; 323/212, 213, 282, 283, 323/272
See application file for complete search history.

(56) References Cited

U.S. PATENT DOCUMENTS

| | | | |
|---|---|---|---|
| 6,344,811 B1 * | 2/2002 | Melanson | 341/143 |
| 6,373,334 B1 * | 4/2002 | Melanson | 330/10 |
| 6,795,004 B2 * | 9/2004 | Masuda et al. | 341/143 |
| 6,885,176 B2 * | 4/2005 | Librizzi | 323/285 |
| 6,911,808 B1 * | 6/2005 | Shimamori | 323/283 |
| 6,958,721 B2 | 10/2005 | Vincent et al. | |
| 6,963,190 B2 * | 11/2005 | Asanuma et al. | 323/283 |
| 7,061,292 B2 | 6/2006 | Maksimovic et al. | |
| 7,113,011 B2 * | 9/2006 | Leung et al. | 327/149 |
| 7,286,009 B2 * | 10/2007 | Andersen et al. | 330/10 |
| 7,362,254 B2 | 4/2008 | Kost | 341/155 |
| 7,595,686 B2 * | 9/2009 | Maksimovic et al. | 327/540 |
| 7,710,092 B2 * | 5/2010 | Chapuis et al. | 323/282 |
| 2006/0055574 A1 | 3/2006 | Maksimovic et al. | |
| 2006/0145899 A1 * | 7/2006 | Markowski et al. | 341/78 |
| 2008/0252277 A1 | 10/2008 | Sase et al. | |
| 2010/0134083 A1 * | 6/2010 | Trescases | 323/283 |

FOREIGN PATENT DOCUMENTS

| | | |
|---|---|---|
| JP | 2005-512493 T | 4/2005 |
| JP | 2008-113542 A | 5/2008 |

* cited by examiner

*Primary Examiner* — Linh Nguyen
(74) *Attorney, Agent, or Firm* — Rabin & Berdo, P.C.

(57) ABSTRACT

A digital control switching power supply unit converts an input voltage into a desired output voltage using a digitally controlled pulse width modulation (PWM) signal according to a switching cycle. The power supply unit includes an analog-to-digital converter (ADC). The ADC converts a result of a comparison between an output voltage and a reference voltage to a digital signal during a conversion cycle. The ADC includes a circuit for outputting a phase difference between a switching cycle and the conversion cycle, and a delay circuit. The delay circuit generates a delay output current based on a result of the comparison and the phase difference and determines the conversion time delay according to the delay output current. The delay circuit also generates a delay reference current based on the reference voltage and the phase difference and determining the duration of the conversion cycle according to the delay reference current.

20 Claims, 17 Drawing Sheets

US 8,164,318 B2

DIGITAL CONTROL SWITCHING POWER SUPPLY UNIT

CROSS-REFERENCE TO RELATED APPLICATION

This application claims priority under 35 U.S.C. §119 from Japanese Patent Application 2009-212103, filed Sep. 14, 2009, the entirety of which is incorporated herein by reference.

BACKGROUND OF THE INVENTION

1. Technical Field

The present invention relates to a switching power supply unit that performs a voltage conversion by carrying out a switching using a pulse width modulation signal (hereafter called a PWM signal), and in particular, relates to a digital control switching power supply unit having an analog-to-digital converter circuit (hereafter called an A/D converter circuit) preferable for control using a digital signal. The present invention also relates to a pulse width modulation (PWM) signal generation circuit for generating a PWM signal to control a switching power supply unit according to a switching cycle. The present invention further relates to an analog-to-digital converter (ADC) operating according to a conversion cycle for converting a current to a digital signal with a conversion time delay such that the conversion cycle is synchronized with an external cycle.

2. Related Art

FIG. 13 illustrates a first exemplary circuit configuration of a heretofore known common digital control switching power supply unit. The digital control switching power supply unit shown in FIG. 13 illustrates an exemplary configuration of a voltage mode, in which a switching element is controlled by a PWM signal and an input voltage Vin is converted to an output voltage Vout. The unit is configured of a subtraction circuit Sub, an A/D converter circuit 11, a digital compensation circuit 21, a digital PWM circuit 31, a switching circuit 41 including a drive circuit DRV and a P-channel MOSFET (hereafter called a PMOS) Q1 and N-channel MOSFET (hereafter called an NMOS) Q2, which are a pair of switching elements controlled by the drive circuit DRV, and an LC smoothing filter 51 including an inductor L and a capacitor C. Also, Vin is a power supply that inputs an input voltage Vin into the digital control switching power supply unit (a power supply and its voltage are given the same reference numerals and characters), and RL is a load circuit.

In the configuration of FIG. 13, a detected value of the output voltage Vout (the output voltage itself, the output voltage divided, the output voltage level shifted, or the like) is fed back, and an error voltage Ve ((Vref−Vout), (Vref−K1·Vout), (Vref−(Vout−K2)), or the like, where K1 and K2 are positive constants) between the detected value and a reference value Vref, which is a target value, is generated by the subtraction circuit Sub. The error voltage Ve is sampled in the A/D converter circuit 11 for each switching cycle Ts, and converted into a digital error signal e (n) (herein, (n) indicates that it is a signal in an $n^{th}$ switching cycle). The digital compensation circuit 21 performs a proportional integral and differential (PID) process on the input digital error signal e (n), and calculates a duty command signal dc (n) that controls the duty of the PWM signal. The digital PWM circuit 31 generates the PWM signal based on the calculated duty command signal dc (n). The switching circuit 41 on-off controls the switching elements Q1 and Q2 in accordance with the PWM signal, the output voltage Vout is obtained by an output of the switching circuit 41 being smoothed by the LC smoothing filter 51, and the load circuit RL is driven.

Herein, as only a small number of bits are necessary in order to express a conversion range or conversion result of the A/D converter circuit in the case of the specifications of the common switching power supply unit, a delay line A/D converter (ADC), which utilizes an element delay time that changes depending on an operating voltage or operating current, is used in the digital control switching power supply unit (for example, refer to JP-T-2005-512493).

FIG. 14 shows an example of a configuration of a heretofore known delay line ADC. The delay line ADC is configured of a delay time adjusting delay element dmy, a delay element array d1 to d (n) configured of n stages of delay elements Dcell connected in series, n flip-flops DFF which store an output of each delay element Dcell at a rising edge of a data storage signal Sample, and an encoder circuit 5 that generates the digital error signal e (n) based on an output of the n flip-flops DFF (out1, . . . , out(n)).

In FIG. 14, the delay element dmy is inserted with the object of adjusting the overall delay time, in order to optimize the delay time of the delay element array d1 to d(n). Also, a control signal Dcont is a signal for controlling the delay times of the delay element dmy and the delay elements Dcell.

FIG. 15 shows a timing chart of the delay line ADC shown in FIG. 14. The delay line ADC carries out an A/D conversion operation for each switching cycle Ts (a cycle of a switching clock CLK-SW, which is a basic clock) of the switching power supply unit. The A/D conversion operation starts at the rise of an A/D conversion start signal Start synchronized with the switching clock CLK-SW, and is reset and finished at the decay of the signal. On the A/D conversion start signal Start being input into the delay element dmy, it is delayed by a delay time tdd by the delay element dmy, transmitted to the delay element d1 at the first stage of the delay element array, then transmitted sequentially through the delay element array d1 to d(n) while being delayed in each delay element by a constant delay time td. Outputs d1 to d(n) (an element and its output are given the same reference numerals and characters) of the delay elements Dcell are stored in the n flip-flops DFF at the rise of the data storage signal Sample, whose timing is set in advance. Then, by data out1 to out(n) stored in the n flip-flops DFF being encoded by the encoder circuit 5, the digital error signal e(n) is obtained.

In this way, the delay line ADC realizes the A/D conversion by appropriately controlling the storage timing with the delay times tdd and td and the data storage signal Sample. Then, the total time of the A/D conversion time and digital compensation circuit 21 duty command signal dc(n) calculation time has to be set so as to be equal to or shorter than the switching cycle Ts (operations of the subtraction circuit Sub and digital PWM circuit 31 can be ignored).

However, in the event that variations in the characteristics of the oscillator generating the switching clock CLK-SW occur due to the effect of a process fluctuation, or the like, the switching cycle Ts also fluctuates. Also, the delay time td of the delay elements Dcell also fluctuates due to the effect of a variation in element size or a parasitic device. For this reason, in order to reliably complete the A/D conversion and duty command signal dc(n) calculation within the switching cycle Ts, even in the event of a variation in switching frequency or delay time occurring, it is necessary to secure a temporal margin, as in the timing chart shown in A of FIG. 16.

Furthermore, in a case of making the switching frequency variable, and setting the frequency on a user side, it is necessary to set in such a way that the A/D conversion and duty command signal dc(n) calculation are completed within a minimum switching cycle stipulated by the specifications. B of FIG. 16 shows a timing chart example in a case of it being possible to set the switching frequency up to two times higher, but the temporal margin is extremely large.

With the digital control switching power supply unit, as a digital signal processing such as a PID (Proportional, Integral and Derivative) calculation is necessary, a feedback control takes longer than with an analog control method, and it is known that there is a problem with transient response characteristics. When applying this delay line ADC to a switching power supply unit, it is necessary to secure a temporal margin as heretofore described, and the delay time further increases. As the temporal margin is the delay time until an A/D conversion result is reflected in the PWM signal, the kind of excessive margin time shown in B of FIG. 16 delays feedback to the output of an A/D conversion result, and the transient response characteristics of the switching power supply unit are worsened considerably.

As a digital control switching power supply unit that improves the transient response characteristics, a circuit structure where a transient fluctuation detector circuit for a time of sudden load change is newly provided separate from the normal digital signal processing circuit, and an output voltage is controlled without going through a digital signal processing at a time of sudden load change, is introduced in JP-A-2008-113542.

FIG. 17 shows a circuit configuration of the digital control switching power supply unit described in JP-A-2008-113542 as a second example of the configuration of a heretofore known digital control switching power supply unit. The same reference numerals and characters are given to places which are the same as in the first exemplary configuration of the heretofore known digital control switching power supply unit shown in FIG. 13, and a detailed description will be omitted.

The digital control switching power supply unit shown in FIG. 17 is configured of a digital signal processing circuit portion 62, the switching circuit 41, the LC smoothing filter 51, a transient fluctuation detector circuit 72 including two comparators CP1 and CP2, and a CR filter 82 including a resistor R2 and a capacitor C2.

The digital signal processing circuit portion 62 is configured of an A/D converter circuit 12, a digital voltage control circuit 22, a digital PWM circuit 32, a Vref±Δ circuit 63 that outputs voltages of reference voltages Vref+Δ and Vref−Δ, and an SEL circuit 64 that selects and outputs a PWM signal at a normal time or at a time of a sudden load change.

At a time of a normal operation (Vref+Δ>Vout>Vref−Δ), a digital signal processing is carried out in the A/D converter circuit 12, digital voltage control circuit 22, and digital PWM circuit 32, and a PWM signal, which is an output of the digital PWM circuit 32, is selected and output to the switching circuit 41 via the SEL circuit 64. That is, the same kind of switching control operation as in the heretofore known first exemplary configuration shown in FIG. 13 is carried out.

Meanwhile, an operation at a time of a sudden load change is such that a sudden load change voltage VoCR detected by the CR filter 82, and the voltages Vref±Δ which are references, are compared by the comparators CP1 and CP2 of the transient fluctuation detector circuit 72, and a drive control method of the switching circuit 41 is selected.

Firstly, in the case of a time of a sudden load reduction (Vout>Vref+Δ), the SEL circuit 64 is controlled by a detection signal α0 of the comparator CP1, and a 0% duty PWM signal is selected and output, thus driving the switching circuit 41. Next, in the case of a time of a sudden load increase (Vout<Vref−Δ), the SEL circuit 64 is controlled by a detection signal α100 of the comparator CP2, and a 100% duty PWM signal is selected and output, thus driving the switching circuit 41. By means of the heretofore described operations, the transient response characteristics of the output voltage Vout at a time of a sudden load change are improved.

The following kinds of problem exist with the heretofore described heretofore known digital control switching power supply units.

Firstly, with the first exemplary configuration example shown in FIG. 13, there is a problem in that there occurs a delay time until the digital error signal e(n), which is the error voltage between the output voltage Vout and reference voltage Vref, is A/D converted by the delay line ADC, and the digital error signal e (n) controls the output voltage Vout via the PWM signal. Thus, the transient response characteristics of the output are worsened.

Also, with the example of the second configuration shown in FIG. 17, quick transient response characteristics are realized by providing the transient fluctuation detector circuit 72, the CR filter 82, and the like, separate from the normal digital signal processing circuit, and controlling with a 0% or 100% duty PWM signal at a time of a sudden load change of the output voltage Vout. However, there is a problem in that a dedicated detector circuit or circuit parts are newly necessary at a time of a sudden load change, and the circuit scale becomes enormous. Also, there is a problem in that signal controls of an operation at a normal time and an operation at a time of a sudden load change become complicated, and furthermore, it is necessary to individually set a sudden load change detection voltage and the voltage range Vref±Δ, which forms a reference, in accordance with the specifications of the switching power supply unit.

SUMMARY OF THE INVENTION

The invention, having been contrived bearing in mind the heretofore described problems, has an object of realizing an A/D converter circuit that optimizes an A/D conversion operation in accordance with a switching frequency, and providing a digital control switching power supply unit whose transient response characteristics do not worsen by using the A/D converter circuit.

In order to achieve the heretofore described object, according to a first aspect of the invention, a switching power supply unit that converts an input voltage into a desired output voltage using a digitally controlled pulse width modulation signal, includes an analog-to-digital converter circuit that includes a delay line circuit that has a delay element array where delay elements through which a delay output current flows, and whose delay time is controlled by the delay output current, are connected in series, and that converts a current value of the delay output current into a digital signal using the signal transmission delay time of the delay element array, a phase difference detector circuit that detects a phase difference between a switching cycle of the pulse width modulation signal and an analog-to-digital conversion cycle of the delay line circuit, a bias current generator circuit that generates a bias current for generating a delay reference current that controls the analog-to-digital conversion cycle in accordance with an output of the phase difference detector circuit, and a delay control current generator circuit that generates the delay output current based on a result of a comparison of a detected value of the output voltage and a reference voltage, and on the bias current.

Also, according to a second aspect of the invention, the delay line circuit includes a first delay cell array that has a first delay element array where delay elements through which the delay output current flows, and whose delay time is controlled by the delay output current, are connected in series, and a memory circuit that stores an output of the delay elements configuring the first delay element array using a timing signal, a second delay cell array that has a second delay element array where delay elements through which the delay reference current flows, and whose delay time is controlled by the delay reference current, are connected in series, and that generates the timing signal and a signal indicating the analog-to-digital conversion cycle, and an encoder circuit that encodes an output of the memory circuit.

Also, according to a third aspect of the invention, the phase difference detector circuit includes a flip-flop circuit that carries out a comparison of the lengths of the switching cycle and analog-to-digital conversion cycle, and a control logic that increments or decrements a bias current indication value, which is a digital signal, in accordance with an output of the flip-flop circuit.

Also, according to a fourth aspect of the invention, the bias current generator circuit includes a digital-to-analog converter circuit that generates a constant current according to the bias current indication value as the bias current.

Also, according to a fifth aspect of the invention, the delay control current generator circuit, having a current where each of the bias currents is copied as an operating current, includes a first differential circuit that has the detected value of the output voltage and the reference voltage as inputs, and outputs a signal determining the delay output current, and a second differential circuit that has signals with the same potential as two inputs, and outputs a signal determining the delay reference current.

Also, according to a sixth aspect of the invention, the delay elements are configured of inverters configured of a pair of P-channel MOSFETs and N-channel MOSFETs connected between a power supply potential and a reference potential, to which a gate and drain are commonly connected, connected in two-stage series, and a MOSFET that causes a current to flow in accordance with a voltage applied to the gate is further connected to a first stage inverter in series with the pair of P-channel MOSFETs and N-channel MOSFETs.

With the digital control switching power supply unit according to the invention, as the A/D converter circuit carries out a conversion operation in synchronization with the switching cycle, an advantage is achieved in that the transient response characteristics are improved with a simple circuit configuration and control method.

DETAILED DESCRIPTION OF THE INVENTION

First Embodiment

Figure 1:
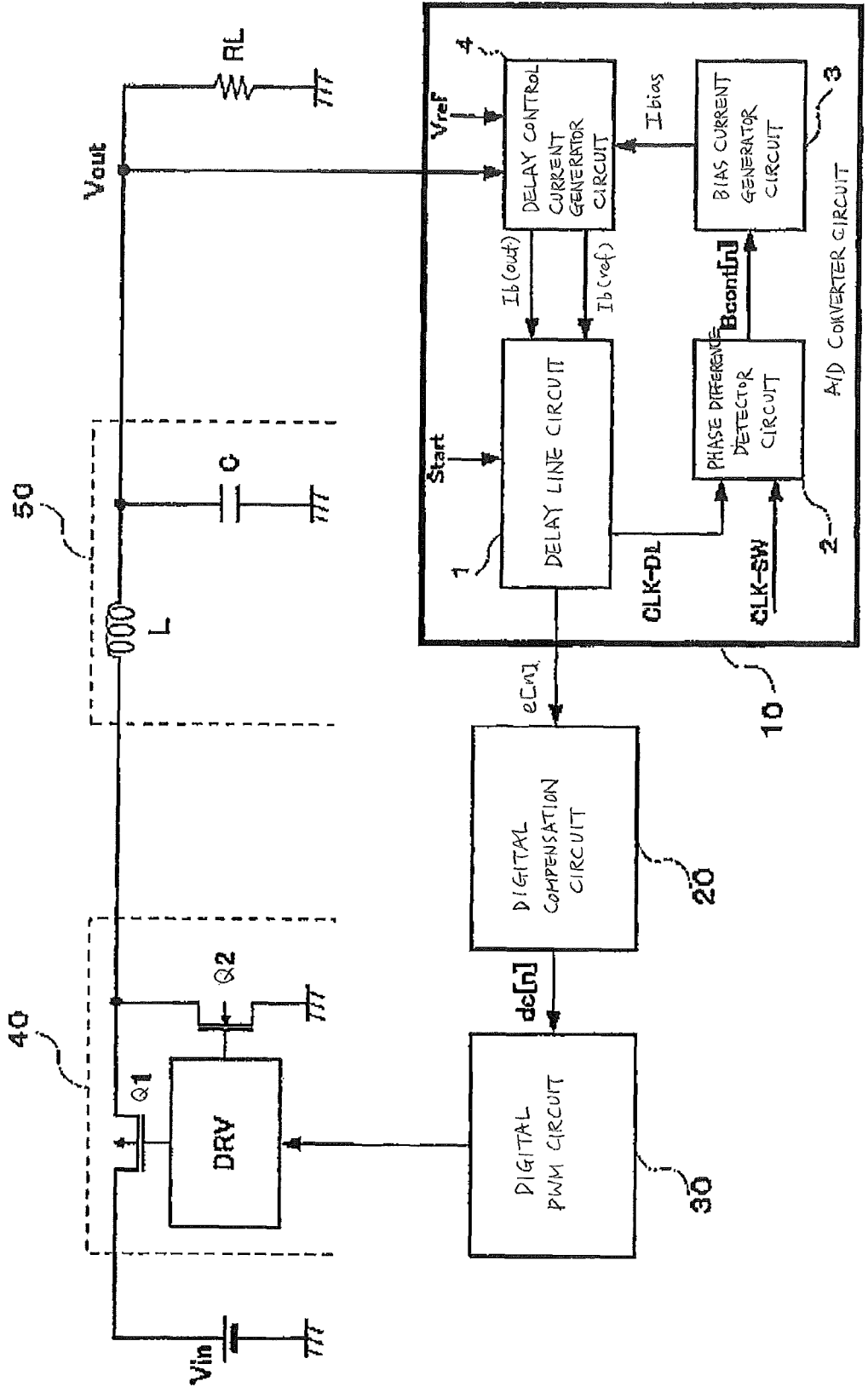
FIG. 1 is a diagram showing an exemplary configuration of a digital control switching power supply unit according to the invention.

Hereafter, a description will be given, while referring to the drawings, of a digital control switching power supply unit according to an embodiment of the invention.

Figure 13:
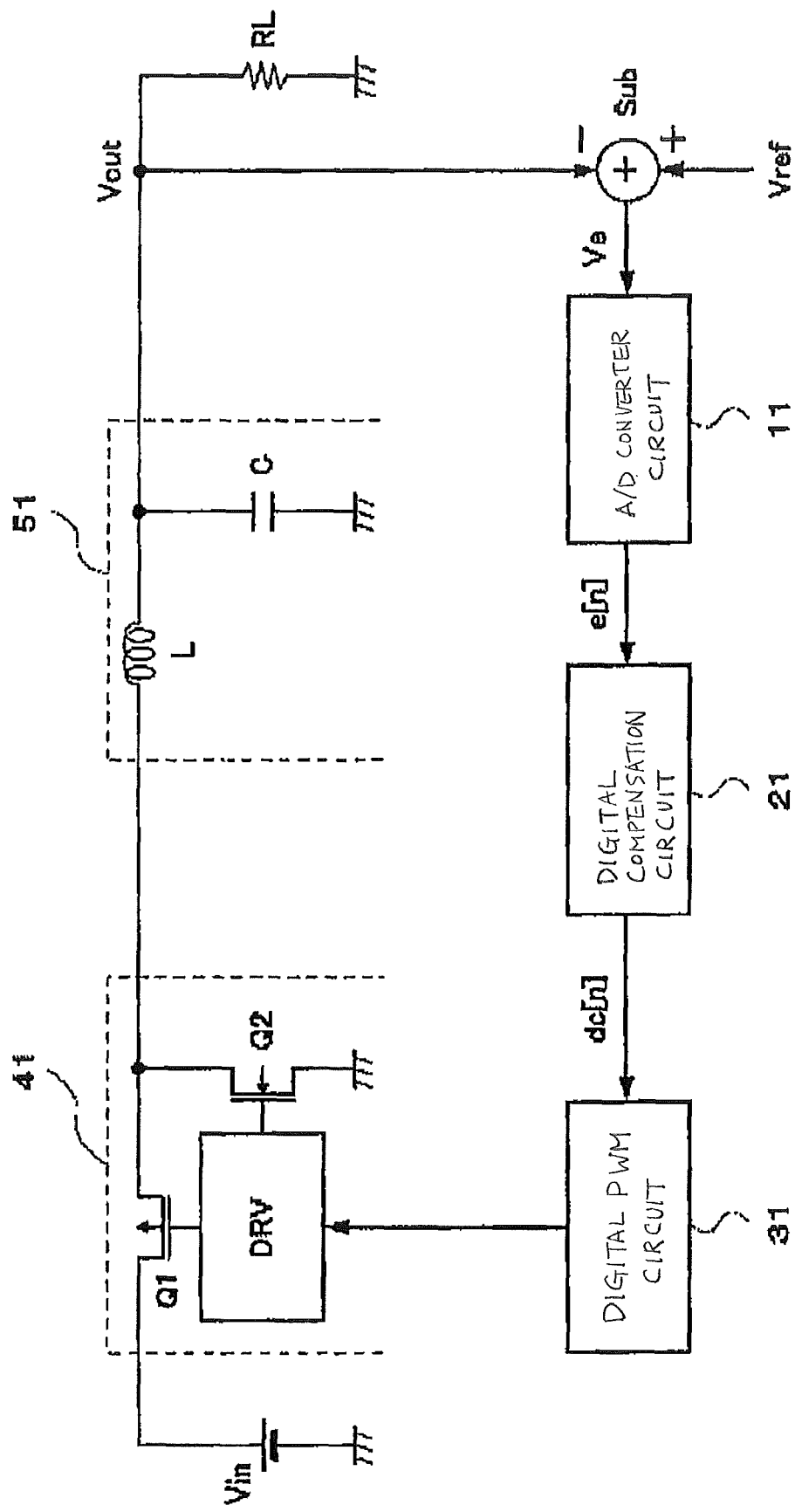
FIG. 13 is a diagram showing an exemplary first configuration of a heretofore known digital control switching power supply unit.
Figure 14:
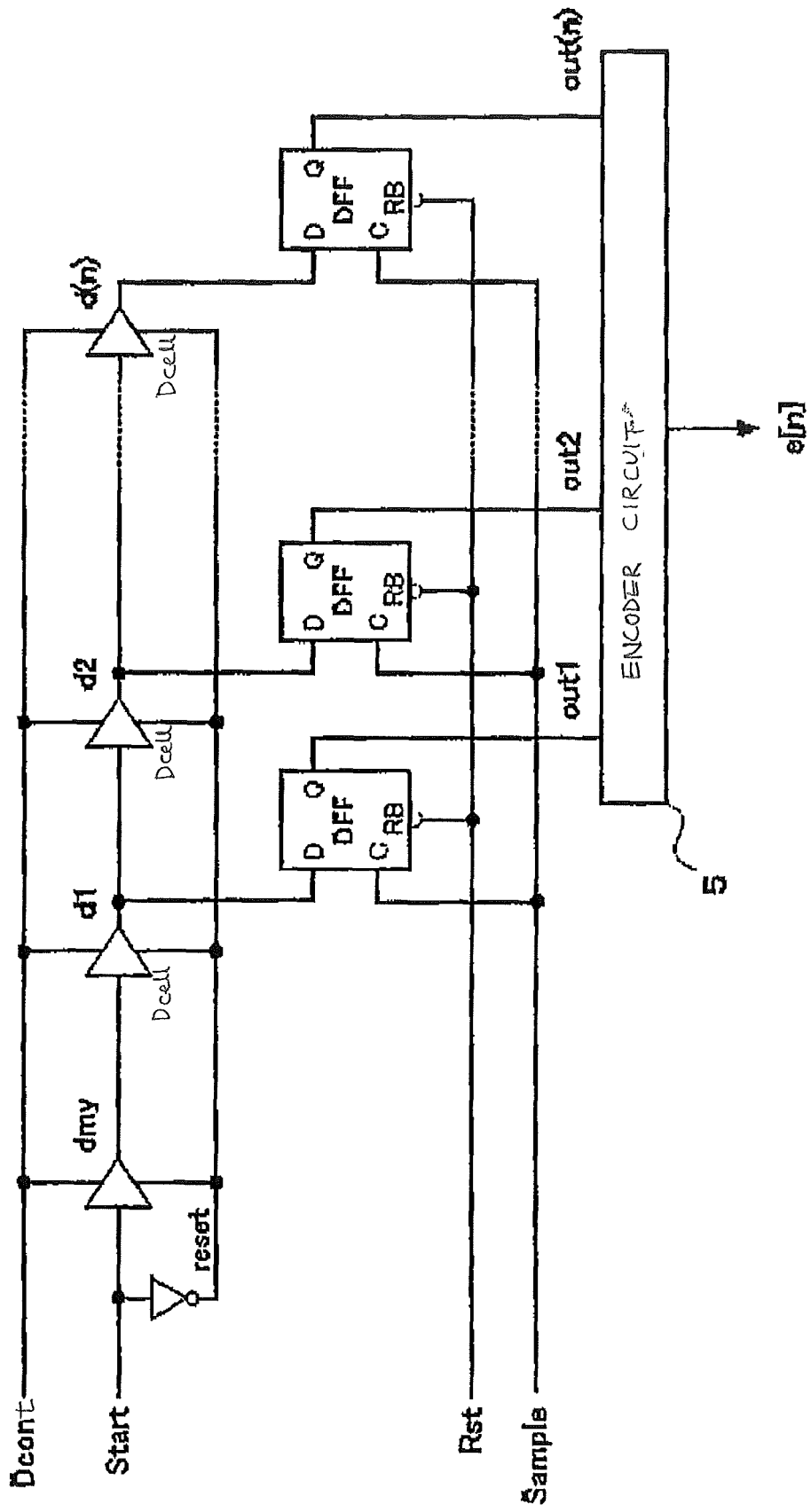
FIG. 14 is a diagram showing the circuit configuration of an example of a delay line ADC in the heretofore known first exemplary configuration.
Figure 15:
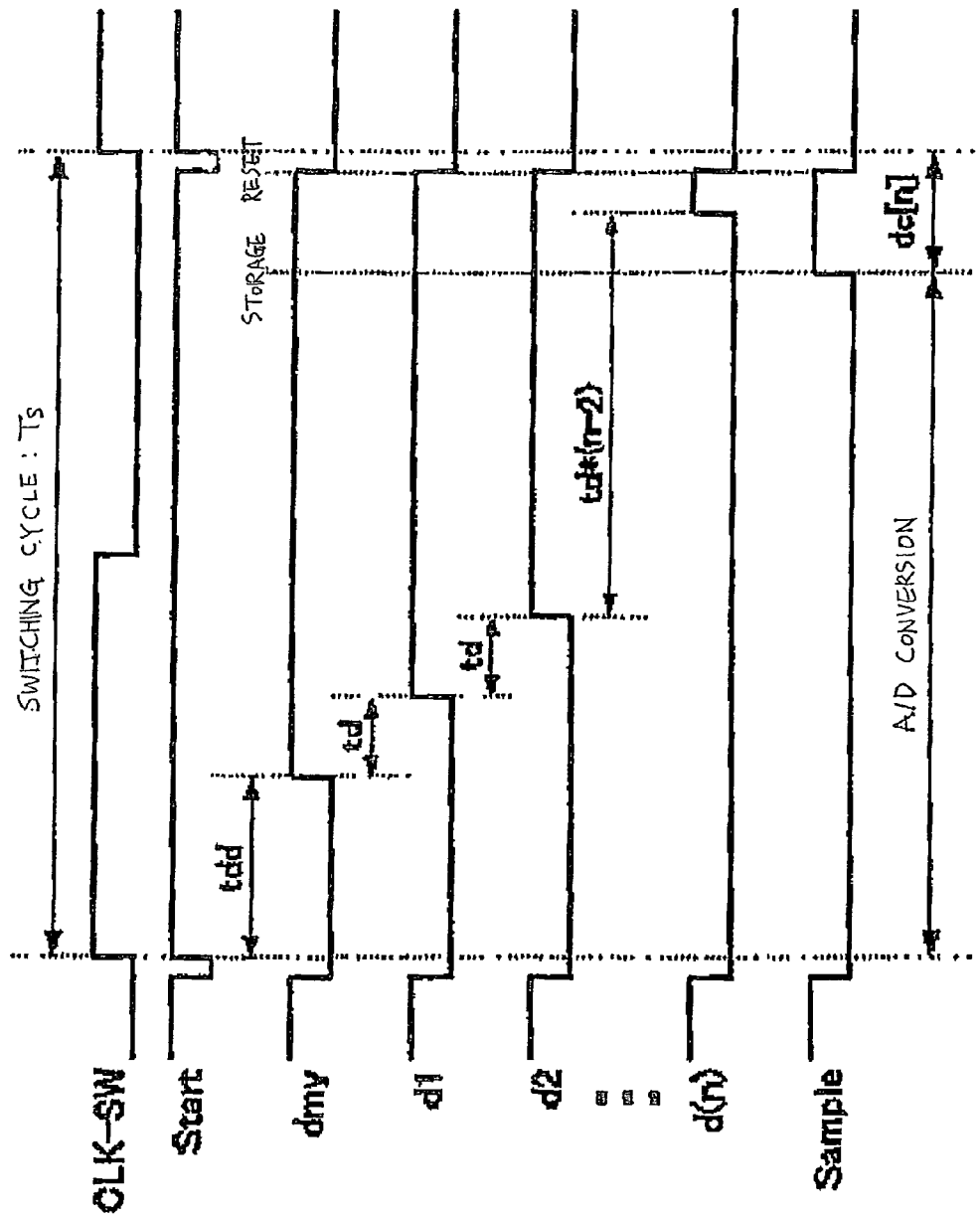
FIG. 15 is a diagram showing a timing chart of the delay line ADC in the heretofore known first exemplary configuration.
Figure 16:
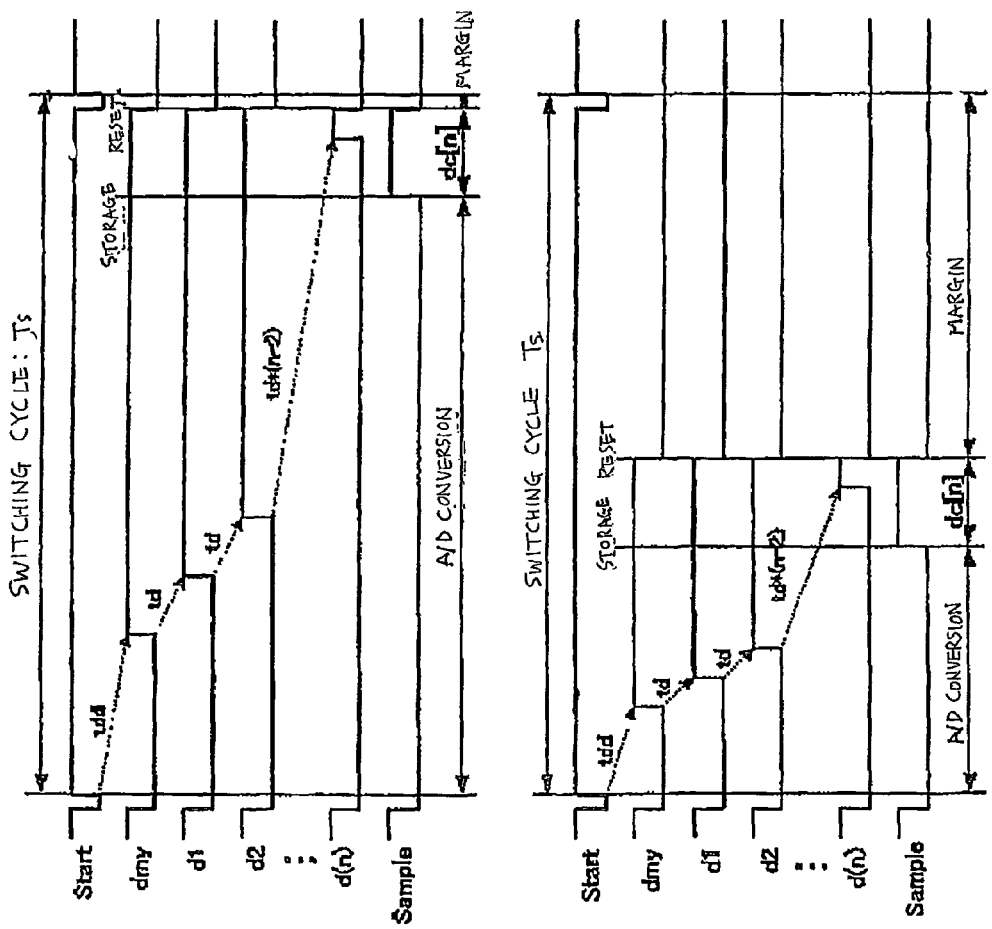
FIG. 16 is a diagram showing a timing chart in a case of considering a variation, and the like, in the delay line ADC in the heretofore known first exemplary configuration.
Figure 17:
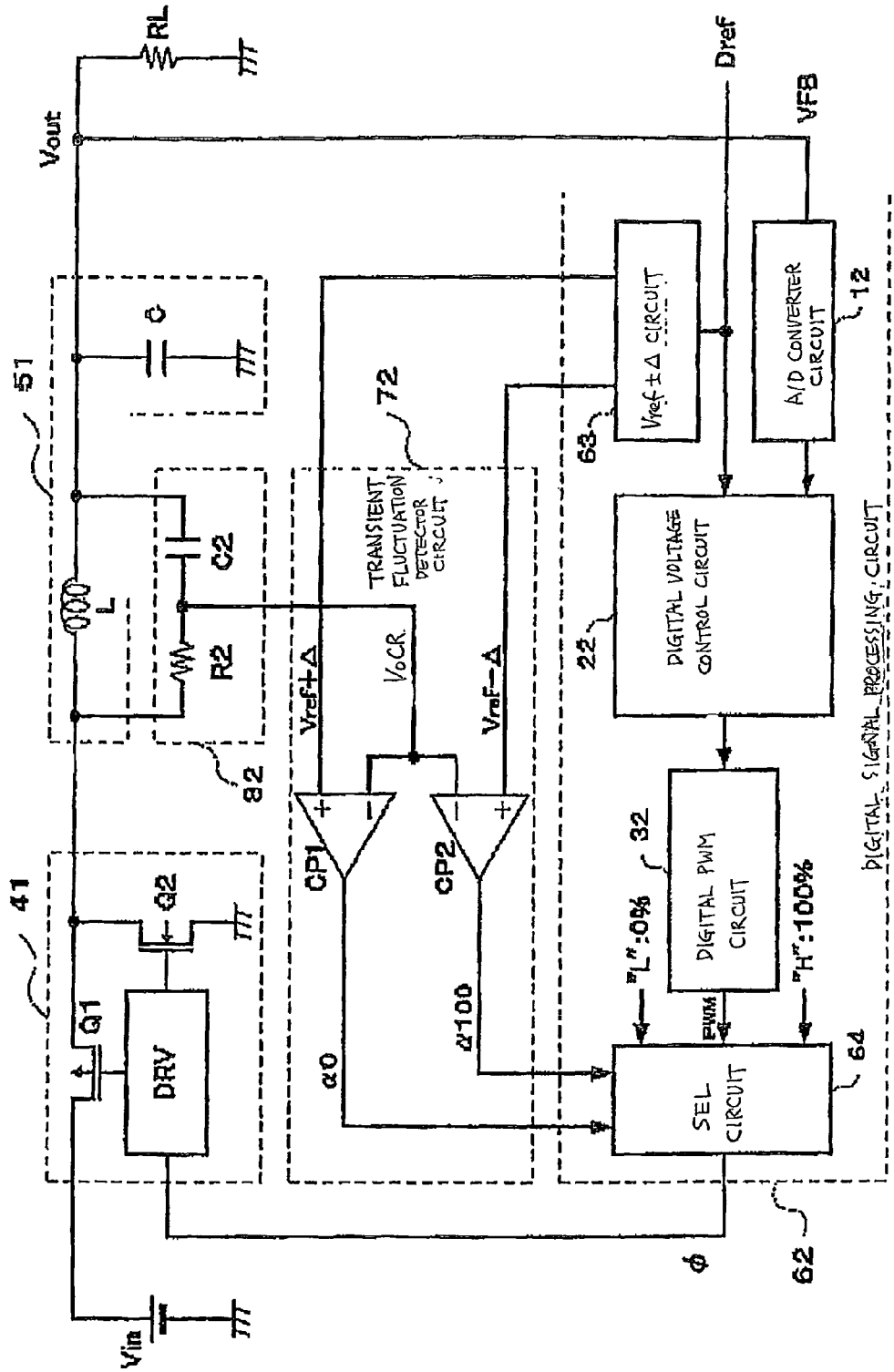
FIG. 17 is a diagram showing a second exemplary configuration of a heretofore known digital control switching power supply unit.

FIG. 1 is a block diagram showing an exemplary configuration example of the digital control switching power supply unit according to the invention. The same reference numerals and characters are given to places which are the same as in first and second examples of heretofore known digital control switching power supply units shown in FIGS. 13 and 17, and a detailed description will be omitted.

The digital control switching power supply unit shown in FIG. 1, is an example of a voltage mode, in which a switching element is controlled by a PWM signal and an input voltage Vin is converted to an output voltage Vout. The unit is configured of an A/D converter circuit 10, a digital compensation circuit 20, a digital PWM circuit 30, a switching circuit 40, and an LC smoothing filter 50. As an operation of the digital control switching power supply unit shown in FIG. 1 is the same as that of the heretofore known digital control switching power supply unit shown in FIG. 13, details will be omitted.

In the digital control switching power supply unit of the example shown in FIG. 1, the A/D converter circuit 10 is configured of a delay line circuit 1, a phase difference detector circuit 2, a bias current generator circuit 3, and a delay control current generator circuit 4.

The delay line circuit 1, having a delay element array whose delay time is controlled by a delay control current signal including a delay output current signal VIb(out) and a delay reference current signal VIb(ref), carries out an A/D conversion operation utilizing a delay time in which an A/D conversion start signal Start is transmitted through the delay element array, and outputs a digital error signal e(n), corresponding to an error voltage between a detected value of an output voltage Vout and a reference voltage Vref which forms a target value, and a delay line clock CLK-DL indicating an A/D conversion cycle.

The phase difference detector circuit 2 detects the phase difference between a switching clock CLK-SW, which forms a basic clock of the switching power supply unit, and the delay line clock CLK-DL indicating the A/D conversion cycle, and outputs a bias current indication value Bcont(n) as a digital signal in accordance with the phase difference.

The bias current generator circuit 3 generates and outputs a bias current Ibias, which forms a reference current for generating the delay control current, in accordance with the bias current indication value Bcont(n).

The delay control current generator circuit 4 generates and outputs the delay output current signal VIb(out) and delay reference current signal VIb(ref) based on the result of the comparison of the detected value of the output voltage Vout and the reference voltage Vref, and on the bias current Ibias.

Figure 2:
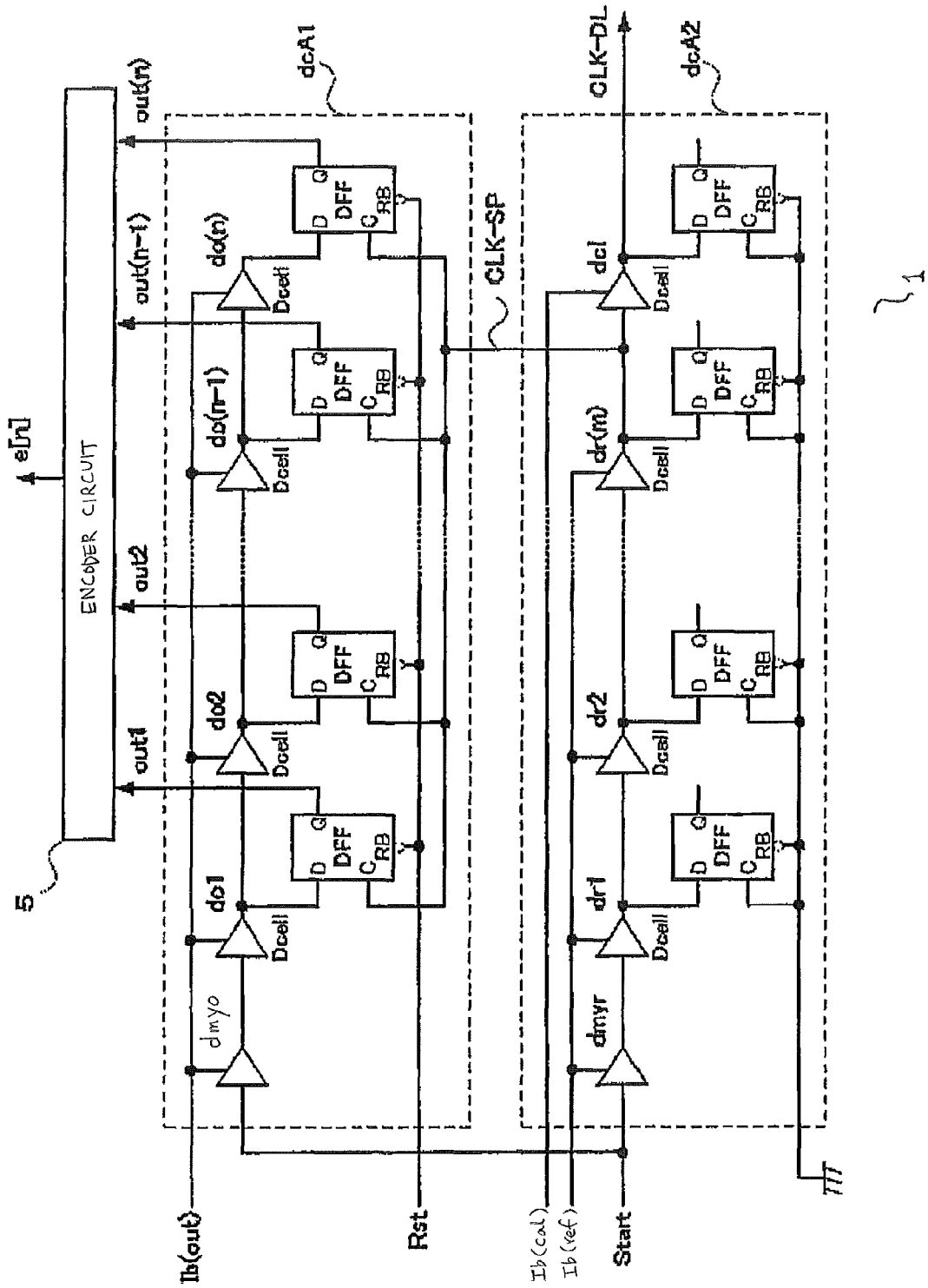
FIG. 2 is a diagram showing an example of a circuit configuration of a delay line circuit according to the invention.

FIG. 2 is a circuit diagram of the exemplary delay line circuit 1 that configures the A/D converter circuit 10 of the invention. The delay line circuit 1 shown in FIG. 2 is configured of two delay cell arrays dcA1 and dcA2, and an encoder circuit 5.

The delay cell array dcA1 is configured of a delay time adjusting delay element dmyo into which the A/D conversion start signal Start is input, a delay element array do1 to do(n) configured of n stages of delay elements Dcell connected in series, and n flip-flops DFF which store data of outputs do1 to do(n) of the delay element array (an element and its output are given the same reference numerals and characters) at a rising edge of a timing signal CLK-SP. The delay output current signal VIb(out) controls delay times tddo and tdo in which the A/D conversion start signal Start is transmitted through the delay element dmyo and delay element array do1 to do(n). That is, the delay output current signal VIb(out) is converted into a delay output current Ib(out) in a way to be described hereafter, and the delay output current Ib(out) is converted into the delay times tddo and tdo. By storing the outputs do1 to do(n) of the delay element array at the rise of the timing signal CLK-SP, generated after a predetermined time, in the n flip-flops DFF, it is possible to obtain data outputs out1 to out(n) where the delay output current signal VIb(out) is converted into a digital signal. That is, the data outputs out1 to out (n) are such that the first k data outputs out1 to out (k) are 1, while the remaining data outputs out (k+1) to out (n) are 0 but, as will be described hereafter, the larger the delay output current signal VIb(out), the smaller k becomes.

The encoder circuit 5 encodes the data outputs out1 to out (n), and generates and outputs the digital error signal e(n).

Meanwhile, the delay cell array dcA2 is configured of a circuit portion that generates the delay cell array dcA1 data storage timing signal CLK-SP, and a circuit portion that generates the delay line clock CLK-DL indicating the A/D conversion cycle.

The circuit portion that generates the data storage timing signal CLK-SP is configured of a delay time adjusting delay element dmyr into which the A/D conversion start signal Start is input, a delay element array dr1 to dr(m) configured of m stages of delay elements Dcell connected in series, and m flip-flops DFF into which outputs dr1 to dr(m) of the delay element array (an element and its output are given the same reference numerals and characters) are input. The delay reference current signal VIb(ref) controls delay times tddr and tdr in which the A/D conversion start signal Start is transmitted through the delay element dmyr and delay element array dr1 to dr(m). That is, the delay reference current signal VIb (ref) is converted into a delay reference current Ib(ref) in a way to be described hereafter, the delay reference current Ib(ref) is converted into the delay times tddr and tdr, and an output dr(m) forms the timing signal CLK-SP.

The circuit portion that generates the delay line clock CLK-DL is configured of a delay element dc1 into which the timing signal CLK-SP is input, and the flip-flop DFF into which the output of the delay element dc1 is input. A delay time tdc1 of the delay element dc1 is a time which is a calculation time for the digital compensation circuit 20 to calculate a duty command signal dc(n), which controls the duty of the PWM signal, based on the digital error signal e(n), and is controlled by a delay calculation current signal VIb (cal) indicating the bias current of the delay element dc1. As the delay calculation current signal VIb(cal) can be set without depending on a switching cycle, it is generated in a circuit separate from the delay control current generator circuit 4.

The time from the A/D conversion start signal Start being input until the delay line clock CLK-DL is output is a time where an A/D conversion time in the delay line circuit 1 and the duty command signal dc(n) calculation time in the digital compensation circuit 20 are added together, and forms a signal indicating the A/D conversion cycle.

In the delay line circuit 1 shown in FIG. 2, in order to balance variations in the delay times of the delay element arrays of the delay cell arrays dcA1 and dcA2, a flip-flop DFF that does not operate is connected to the delay cell array dcA2 too, and the wire resistance and parasitic capacity of the two delay cell arrays are adjusted.

Figure 3:
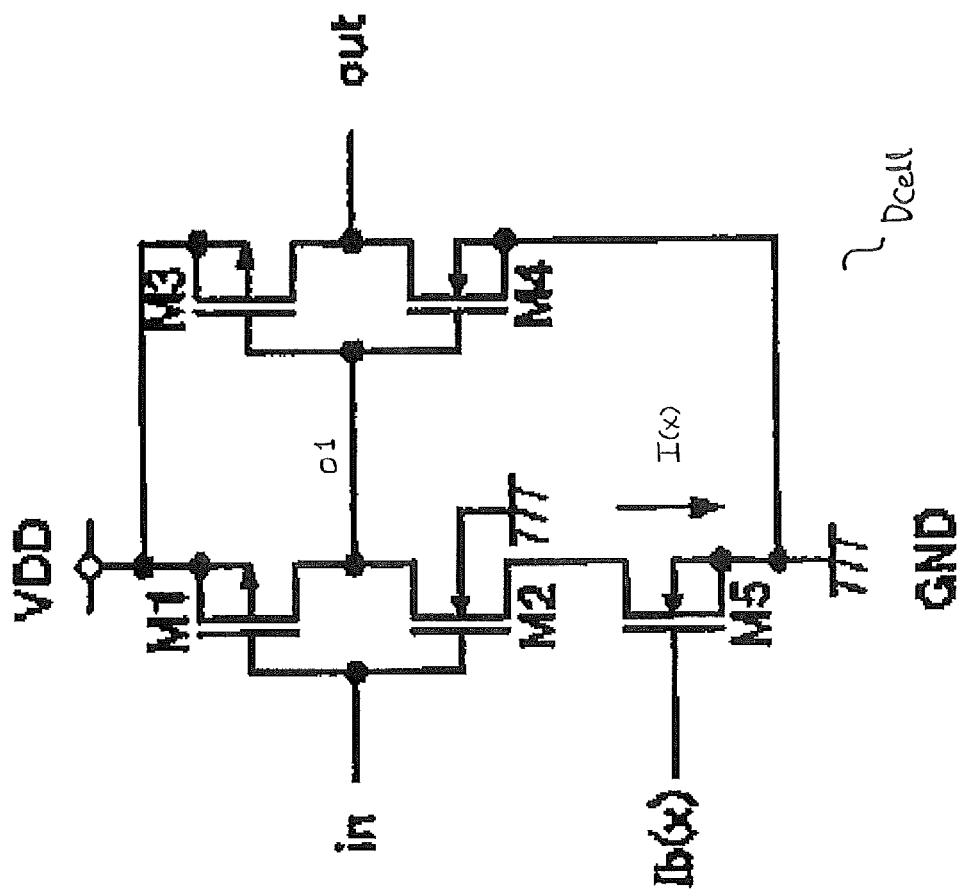
FIG. 3 is a diagram showing an example of a circuit configuration of a delay element according to the invention.

FIG. 3 is an example showing the basic configuration of the delay elements Dcell used in the delay cell arrays dcA1 and dcA2 of the embodiment. The delay elements Dcell are configured of a buffer circuit where inverters formed of a pair of PMOSs and a pair of NMOSs are connected in two-stage series between a power supply potential VDD and a reference potential GND, and an NMOS (M5) controlled by a delay control current signal VIb (x) is inserted between the NMOS (M2) of the first stage inverter and the reference potential GND. By a current flowing through the NMOS (M2) being controlled to a constant current I(x) by the delay control current signal VIb(x), an output signal out, where an input signal in is delayed a predetermined time, is generated. The delay output current signal VIb(out) and delay reference current signal VIb(ref) are provided as the delay control current signal VIb(x) to each of the delay elements Dcell of the delay cell arrays dcA1 and dcA2, because of which the delay output current Ib(out) and delay reference current Ib(ref) flow as the constant current I(x) through the delay elements Dcell of the delay cell arrays dcA1 and dcA2.

Figure 4:
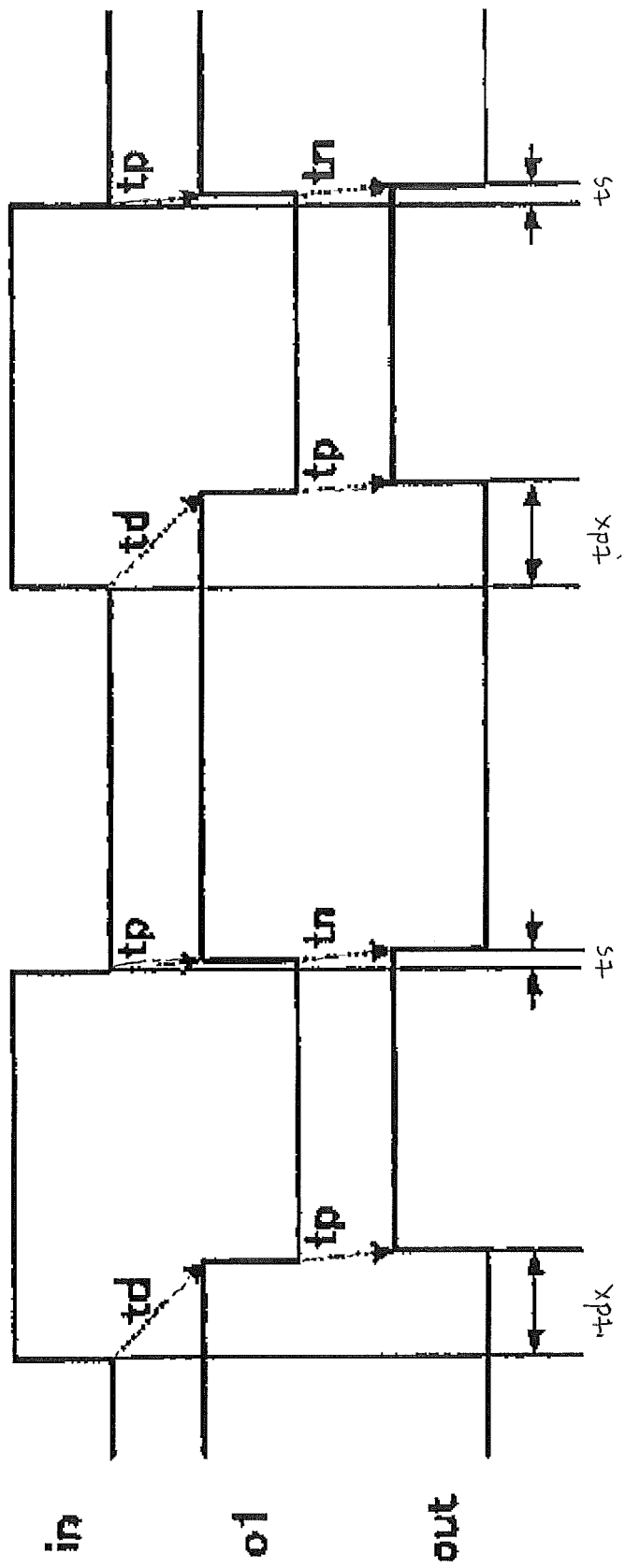
FIG. 4 is a diagram showing a timing chart of an input-output of the delay element according to the invention.

FIG. 4 shows a timing chart of the delay element Dcell shown in FIG. 3. An output signal o1 of the first stage inverter being a signal where the input signal in is inverted, its decay is delayed by the NMOS (M2) by a delay time td controlled by the delay control current signal VIb(x), and the delay of its rise is a switching delay time tp of a PMOS (M1). The output signal out being a signal where the output signal o1 of the first stage inverter is inverted, the delays of its rise and decay are switching delay times tp and tn of a PMOS (M3) and an NMOS (M4). That is, the output signal out is such that the rise of the input signal in is delayed by a delay time tdx (td+tp), and its decay is the delay of a switching delay time ts (tp+tn). Herein, as the switching delay time ts (tp and tn) is determined by a transistor on resistance, gate capacity, parasitic capacity, and the like, it is possible, by fixing the power supply potential VDD, to set a predetermined delay time tdx by means of the delay control current signal VIb(x).

Figure 5:
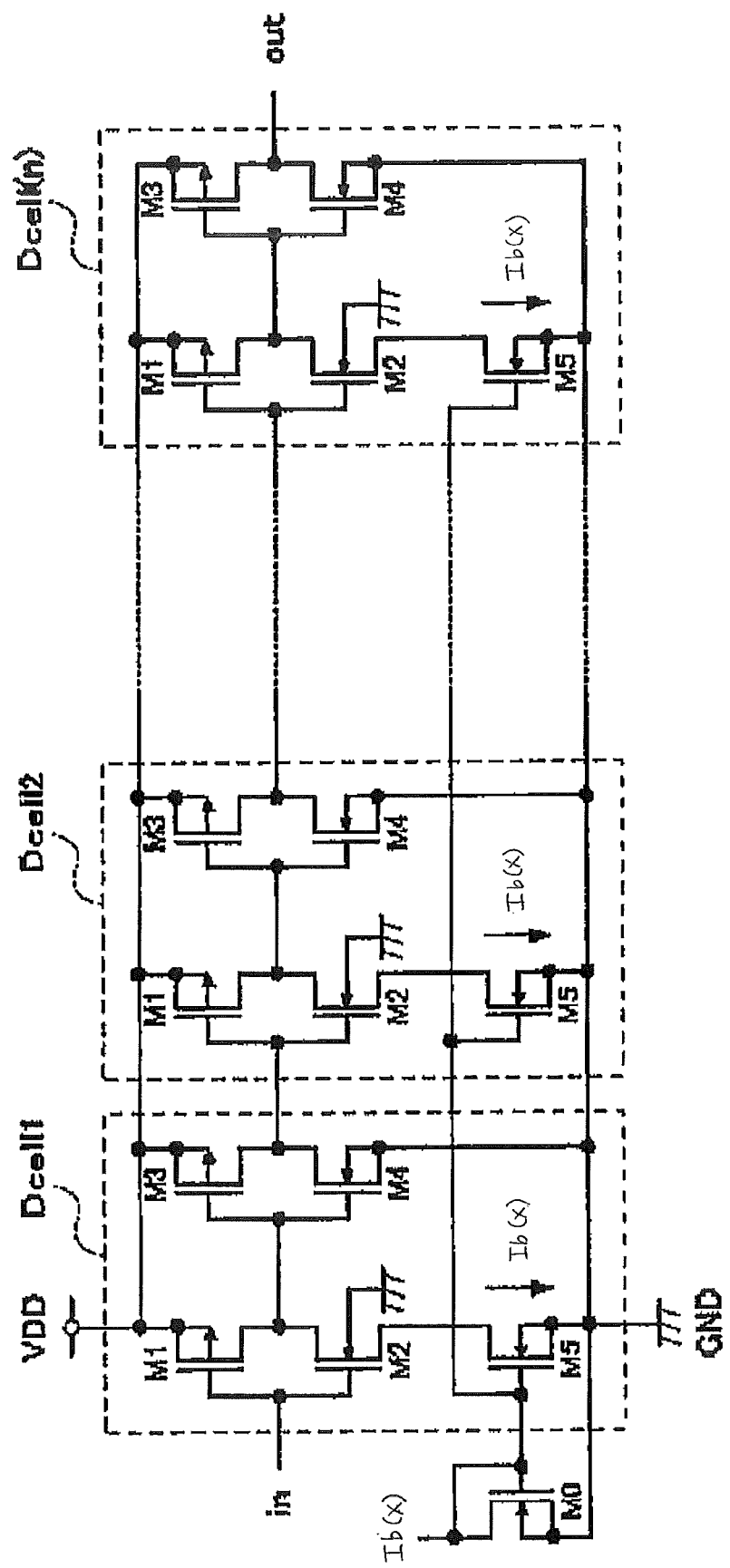
FIG. 5 is a diagram showing a configuration example of a delay element array according to the invention.

FIG. 5 shows one example where the delay elements Dcell shown in FIG. 3 are connected in series, configuring a delay element array. n stages of the delay elements Dcell are connected in series, and by copying and generating Ib(x), which is a delay control current, in a current mirror circuit configured of an NMOS(M0) and the NMOS(M5), it is possible to accurately control the delay time tdx of each delay element Dcell.

Figure 6:
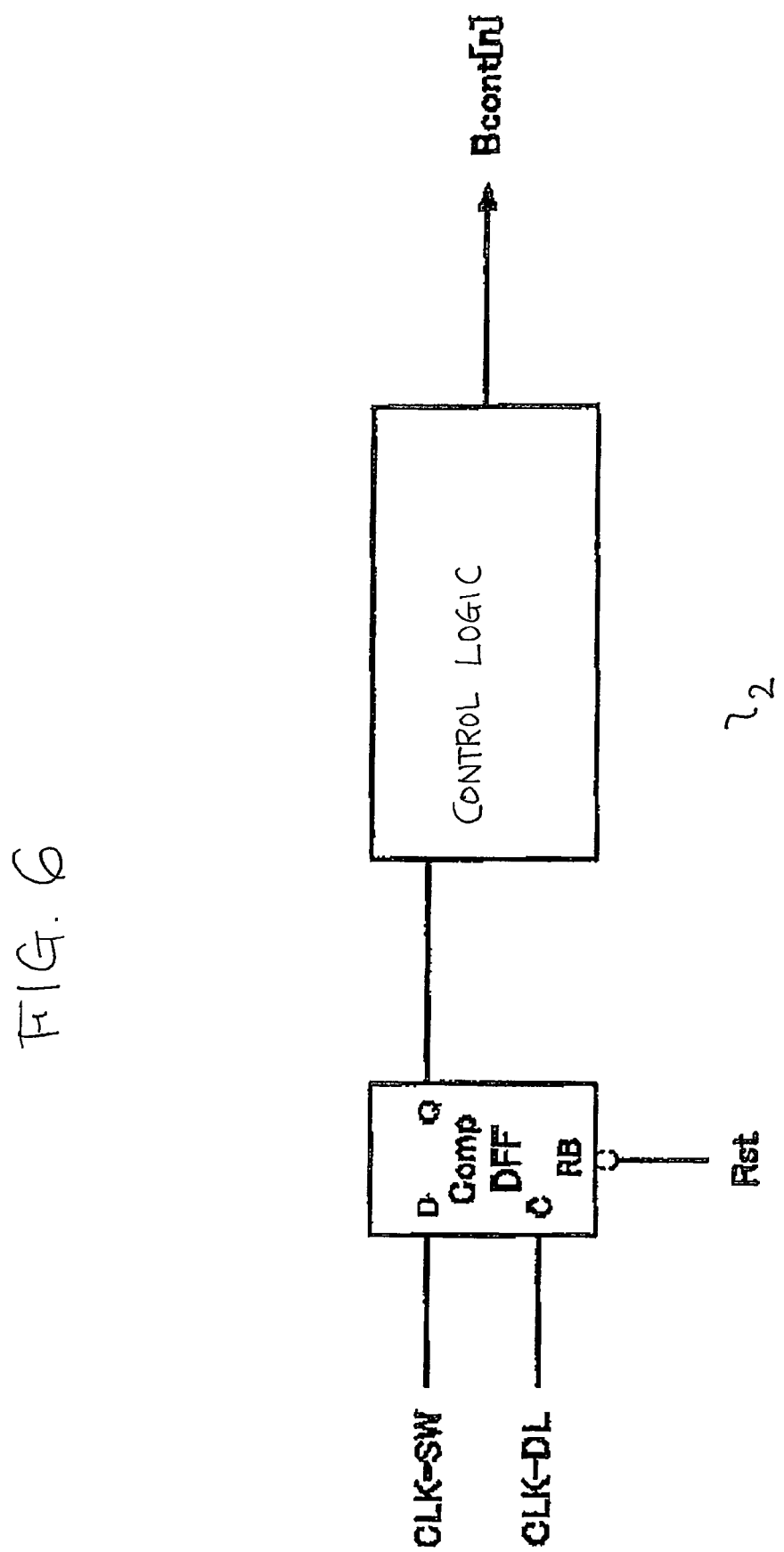
FIG. 6 is a diagram showing an example of a circuit configuration of a phase difference detector circuit according to the invention.

FIG. 6 illustrates an exemplary circuit configuration of the phase difference detector circuit 2 configuring the A/D converter circuit 10 of the invention. The phase difference detector circuit 2 shown in FIG. 6 is configured of a flip-flop CompDFF, which compares the lengths of the A/D conversion cycle and switching cycle by detecting (latching) the level of the switching clock CLK-SW at the rising edge of the delay line clock CLK-DL indicating the A/D conversion cycle of the delay line circuit 1, and a control logic that increments or decrements a bias current indication value Bcont (n) provided to the bias current generator circuit 3 based on the result of the length comparison.

Figure 12:
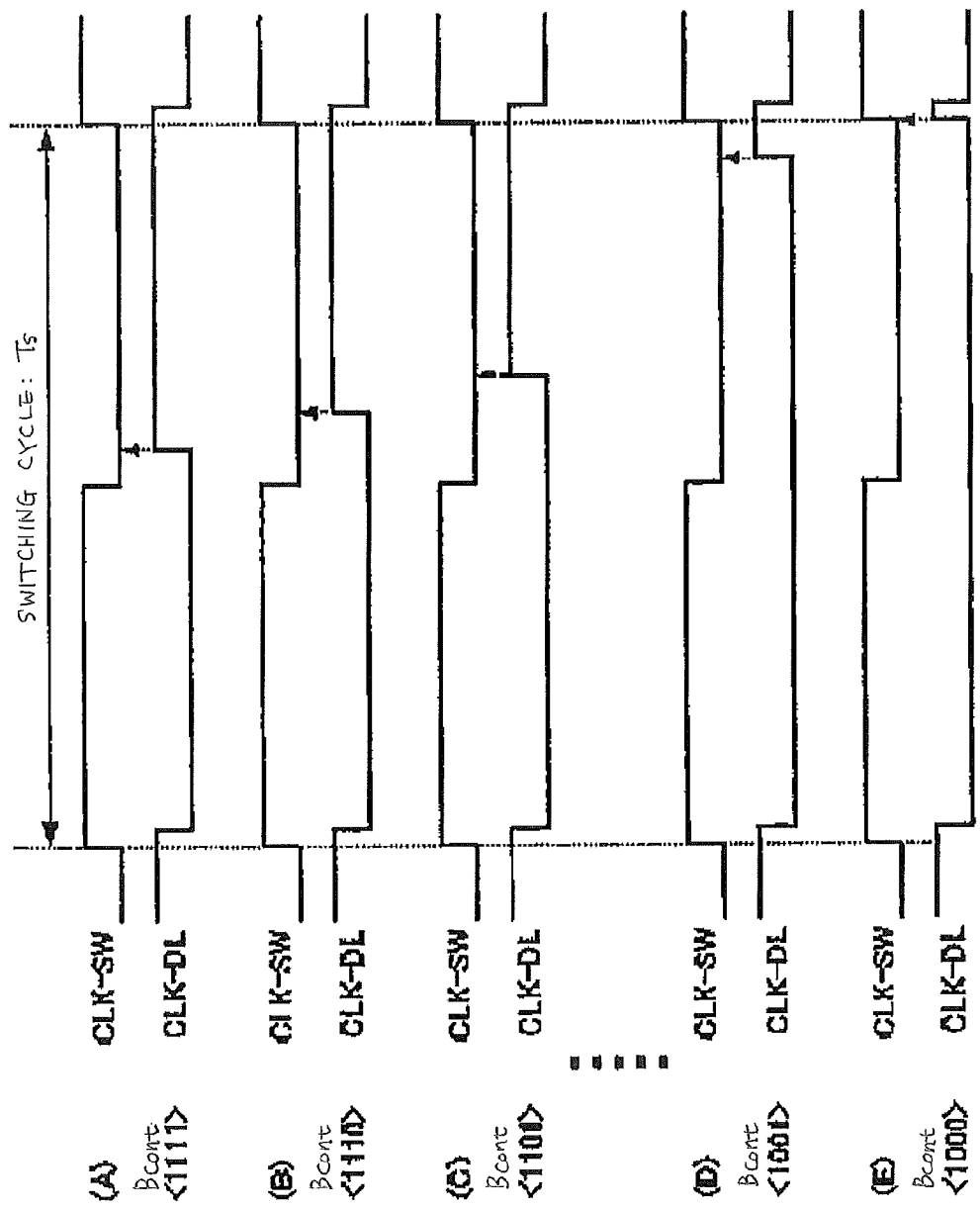
FIG. 12 is a diagram showing a timing chart of an example of a synchronization sequence when starting up the digital control switching power supply unit according to the invention.

As illustrated in FIG. 12, to be described hereafter, an operation of the phase difference detector circuit 2 shown in FIG. 6 is such that in a case in which the output of the comparison flip-flop CompDFF is at an L level, as it indicates that the A/D conversion cycle (CLK-DL) is shorter than a switching cycle Ts, a control is carried out in such a way that the bias current indication value Bcont (n) is decremented, and the bias current Ibias reduced, thus lengthening the A/D conversion cycle. Meanwhile, in a case in which the output of the comparison flip-flop CompDFF is at an H level, as it indicates that the A/D conversion cycle is longer than the switching cycle Ts, a control is carried out in such a way that the bias current indication value Bcont(n) is incremented, and the bias current Ibias increased, thus shortening the A/D conversion cycle.

Figure 7:
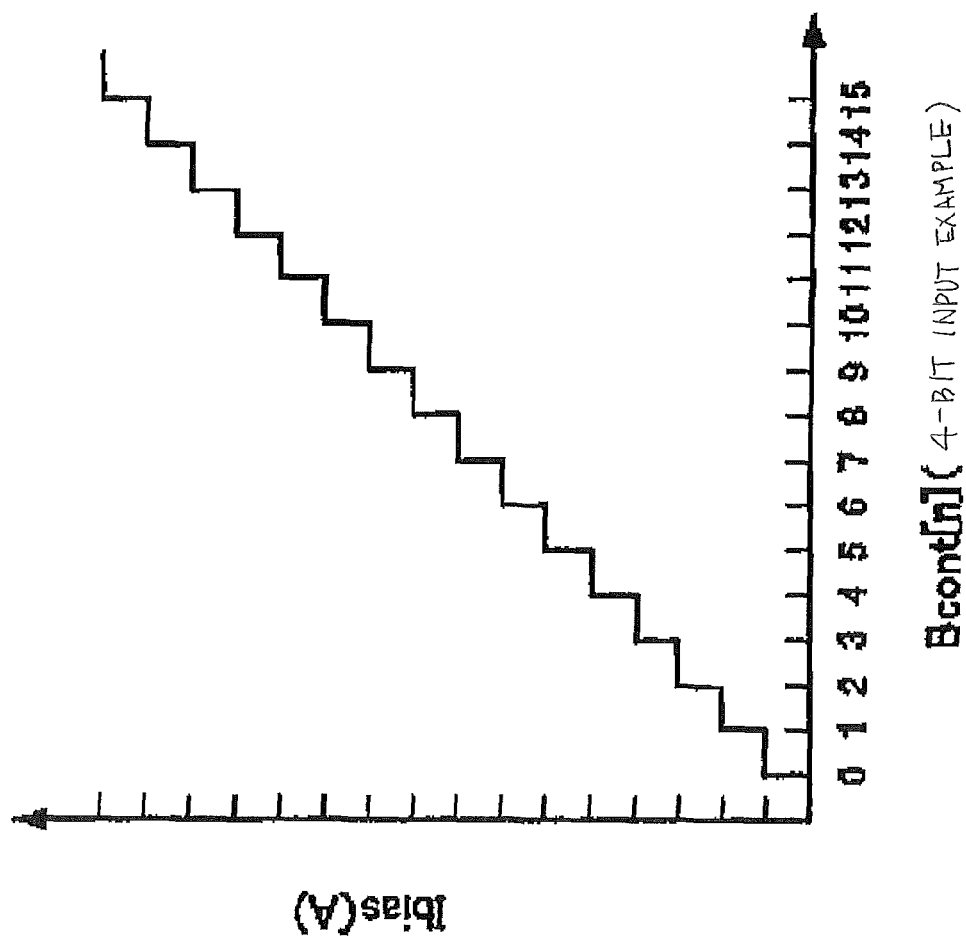
FIG. 7 is a diagram showing an example of input-output characteristics of a bias current generator circuit according to the invention.

FIG. 7 is an example of input-output characteristics of the bias current generator circuit 3 configuring the A/D converter circuit 10 of the invention. The input-output characteristics example shown in FIG. 7 shows a case in which the bias current indication value Bcont(n) of the phase difference detector circuit 2, which is an input signal, is of 4 bits, and the bias current generator circuit 3 is configured of a current output type of digital-to-analog converter circuit which outputs a current value corresponding to the input digital value.

Figure 8:
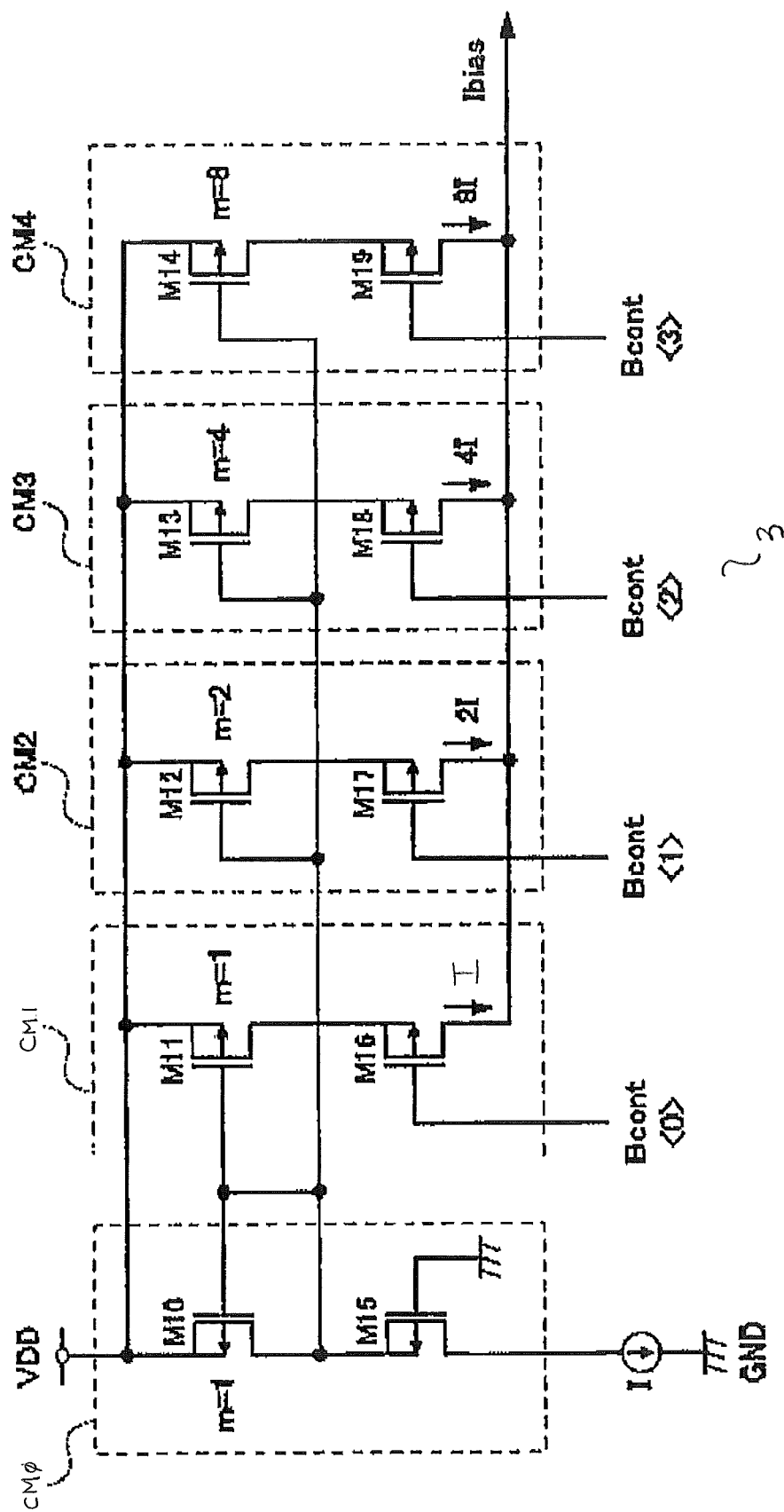
FIG. 8 is a diagram showing an example of a circuit configuration of the bias current generator circuit according to the invention.

FIG. 8 shows one example of a case in which the bias current generator circuit 3 is configured of a 4-bit current mirror circuit. The bias current generator circuit 3 shown in FIG. 8 is configured of circuit blocks CM0 to CM4 where PMOSs (M10 to M14) forming the current mirror circuit, and PMOSs (M15 to M19) forming a switching circuit, are connected in series. The current mirror circuit is such that a 4-bit weighting (m=1) ($2^0$), 2 ($2^1$), 4 ($2^2$), and 8 ($2^3$) (as a weighting method, configuring by connecting basic circuits in parallel, or the like, is available)) is carried out and, with a constant current (I) of the circuit block CM0 as a reference current, a constant current output of the circuit block CM1 is (1I), a constant current output of the CM2 is (2I), a constant current output of the CM3 is (4I), and a constant current output of the CM4 is (8I). The bias current indication value Bcont(n), by on-off controlling the switching circuit of each circuit block, and selecting and outputting the constant current of each circuit block, generates the predetermined bias current Ibias. The bias current Ibias is input into the delay control current generator circuit 4, which controls the delay time of the delay element array, and controls in such a way that the phases of the switching clock CLK-SW and delay line clock CLK-DL match.

Figure 9:
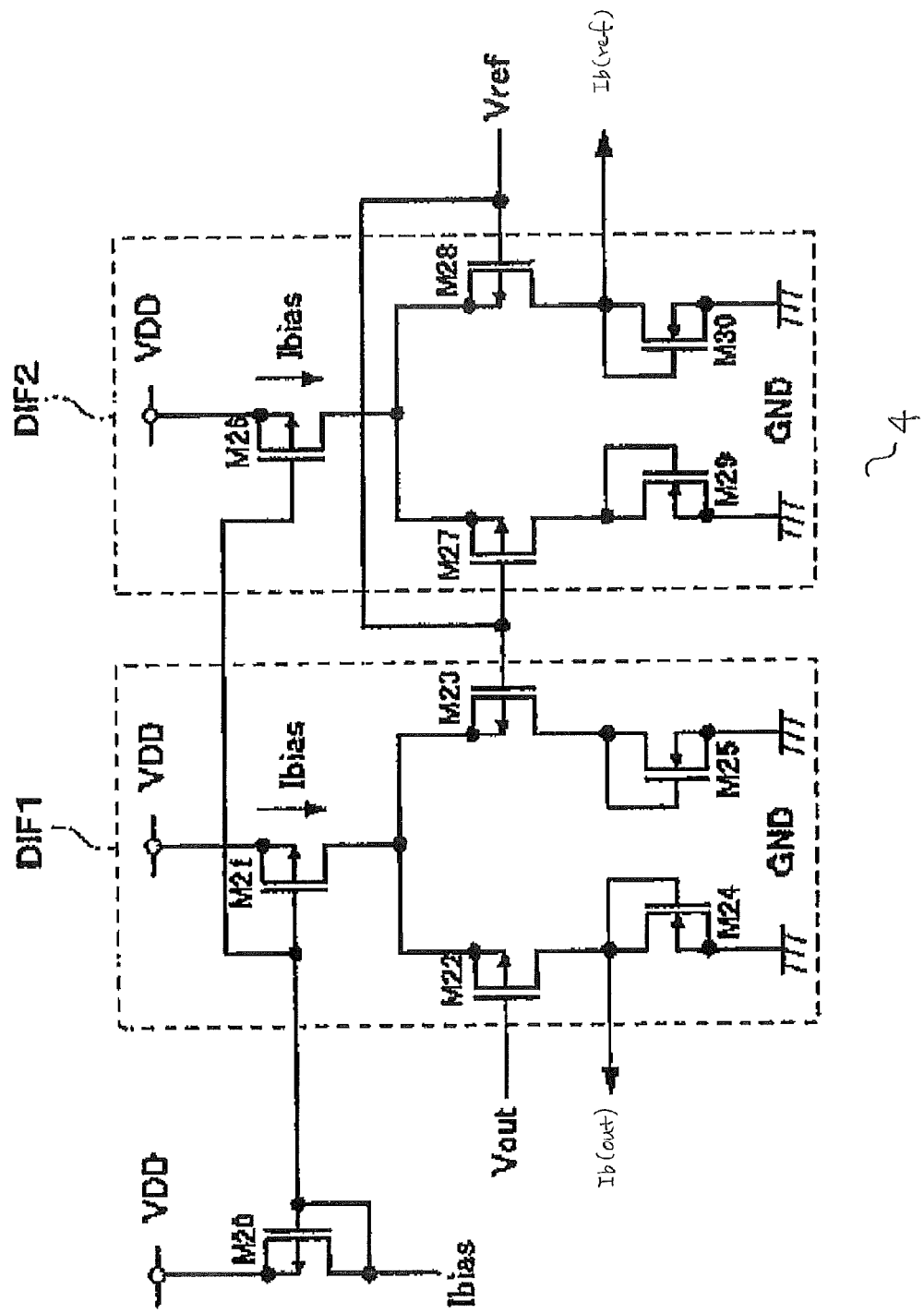
FIG. 9 is a diagram showing an example of a configuration of a delay control current generator circuit according to the invention.

FIG. 9 illustrates an exemplary circuit configuration of the delay control current generator circuit 4 configuring the A/D converter circuit 10 of the invention. The delay control current generator circuit 4 shown in FIG. 9 is configured of two differential circuits DIF1 and DIF2. An operating current of the differential circuits is generated by the bias current Ibias of the bias current generator circuit 3 being copied in a current mirror circuit including a PMOS (M20) and PMOSs (M21 and M26), and a differential portion, two pairs of serially connected pairs of PMOSs and NMOSs being connected in parallel, is configured of PMOSs (M22 and M23, and M27 and M28) to which a differential input is connected, and NMOSs (M24 and M25, and M29 and M30) to which a gate and drain are commonly connected.

In FIG. 9, the differential circuit DIF2 is such that, as the reference voltage Vref is commonly connected to two differential inputs, that is, as the two differential inputs are equal, the delay reference current Ib(ref) of the current value indicated by the delay reference current signal VIb (ref) controlling the delay time tdr of the delay cell array dcA2 is Ibias/2.

Figure 10:
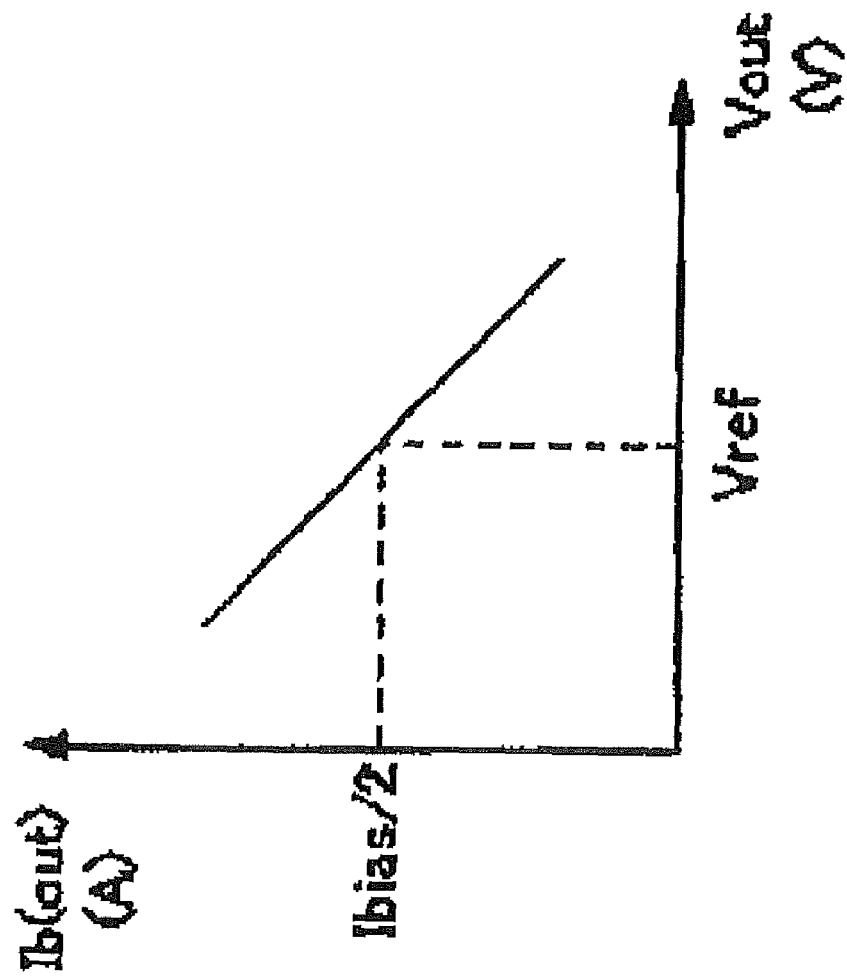
FIG. 10 is a diagram showing an example of input-output characteristics of the delay control current generator circuit according to the invention.

Meanwhile, the differential circuit DIF1 is such that, as the output voltage Vout and reference voltage Vref are connected to two differential inputs, the delay output current Ib(out) of the current value indicated by the delay output current signal VIb (out) controlling the delay time tdo of the delay cell array dcA1 has the kind of input-output characteristics shown in FIG. 10. That is, the delay output current Ib(out), as shown below, increases and decreases centered on Ibias/2, in accordance with the potential relationship between the output voltage Vout and reference voltage Vref.

1. When Vref<Vout Ib(out)<Ibias/2
2. When Vref=Vout Ib(out)=Ibias/2
3. When Vref>Vout Ib(out)>Ibias/2

By generating the delay control current in accordance with the potential relationship between the output voltage Vout and reference voltage Vref in this way, it is possible to control the delay time of the delay cell arrays dcA1 and dcA2.

Figure 11:
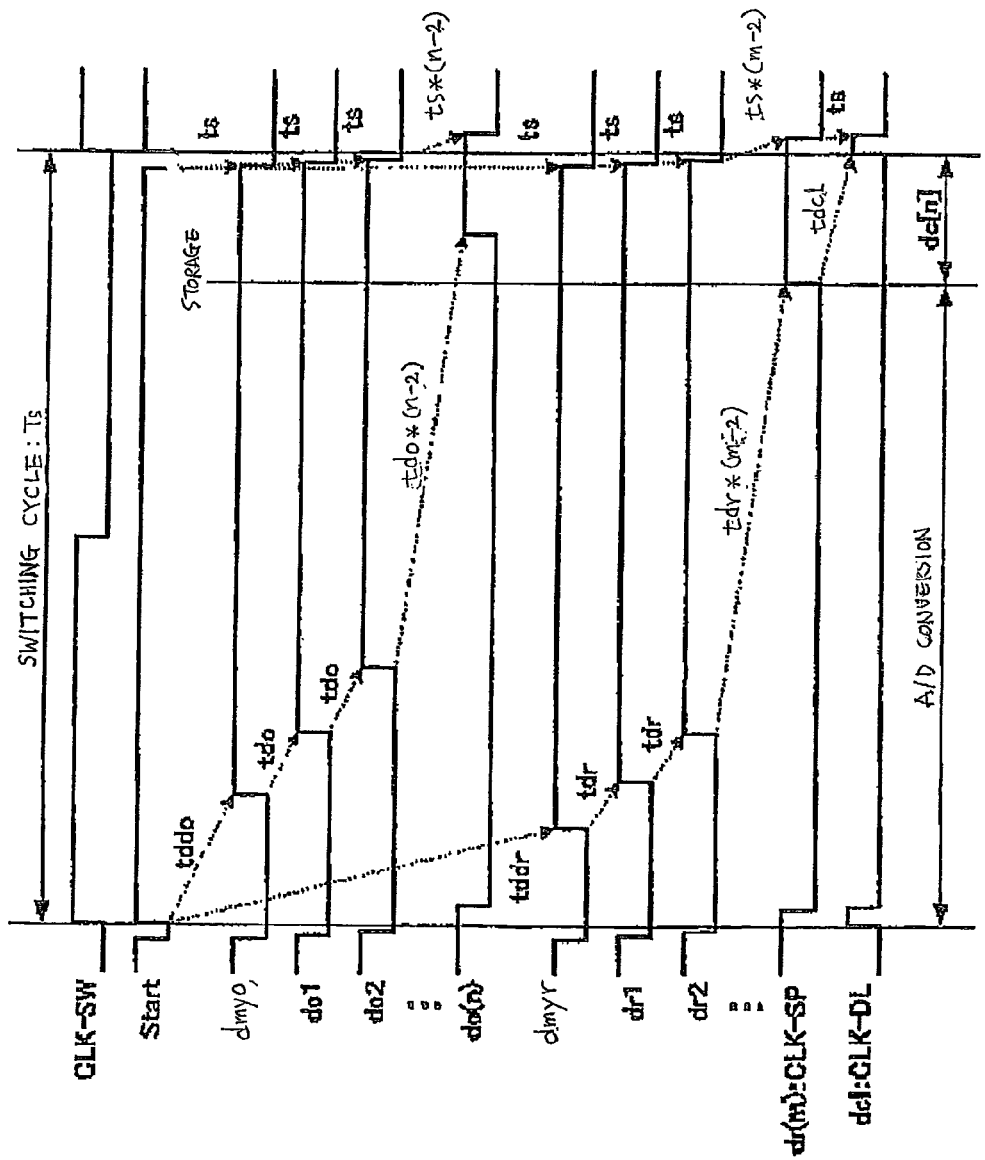
FIG. 11 is a diagram showing a timing chart of an A/D converter circuit according to the invention.

FIG. 11 shows a timing chart of the A/D converter circuit 10 of the invention. The switching clock CLK-SW and A/D conversion start signal Start being in synchronization, the A/D conversion operation starts at the rise of the A/D conversion start signal Start, and finishes at its decay. The A/D conversion start signal Start is input commonly into the delay cell arrays dcA1 and dcA2, and is transmitted inside the delay element arrays.

Firstly, the delay cell array dcA1 is such that, the delay time of the delay elements being controlled by the delay output current signal VIb(out), on the rise of the A/D conversion start signal Start being input into the delay element dmyo, it is delayed by the delay time tddo in the delay element dmyo, transmitted to the delay element do1 at the first stage of the delay element array, then transmitted sequentially through the do1 to do (n) within the delay element array while being delayed in each delay element by the delay time tdo.

Also, the delay cell array dcA2 is such that, the delay time of the delay elements being controlled by the delay reference current signal VIb(ref), on the rise of the A/D conversion start signal Start being input into the delay element dmyr, it is delayed by the delay time tddr in the delay element dmyr, transmitted to the delay element dr1 at the first stage of the delay element array, then transmitted sequentially through the dr1 to dr (m) within the delay element array while being delayed in each delay element by the delay time tdr. Then, at a timing at which the rise of the A/D conversion start signal Start is transmitted to the delay element dr(m), that is, at a timing of the rise of the timing signal CLK-SP that stores data, the output data of the delay element array do1 to do(n) of the delay cell array dcA1 are stored in the corresponding flip-flops DFF. Furthermore, the timing signal CLK-SP, which is the output of the delay element dr(m), is transmitted to the delay element dc1, delayed by the delay time tdc1, and the delay line clock CLK-DL is output.

Next, on the A/D conversion start signal Start decaying, the delay element arrays of the delay cell arrays dcA1 and dcA2, based on that information, transmit the decay sequentially while delaying it by the delay time is in each delay element, the output of each delay element decays, and one cycle of the A/D conversion operation is completed.

Herein, the time from the rise of the A/D conversion start signal Start to the rise of the timing signal CLK-SP is taken to be the A/D conversion time, and the time from the rise of the timing signal CLK-SP to the rise of the delay line clock CLK-DL is taken to be the duty command signal dc(n) calculation time. In the embodiment, by synchronizing the delay line clock CLK-DL indicating the finish of the A/D conversion cycle, which is the total time of the A/D conversion time and duty command signal dc(n) calculation time, with the finish timing of the switching cycle Ts, the securing of a temporal margin with respect to the conversion time is unnecessary, and an optimum A/D conversion operation is realized.

Herein, with a switching power supply unit using a PWM control method, a switching cycle Ts setting change is rarely carried out during an operation. For this reason, with the digital control switching power supply unit of the invention, it is sufficient that a synchronization sequence synchronizing the A/D conversion cycle and switching cycle Ts is executed when starting up.

A to E of FIG. 12 are a timing chart showing one example of a synchronization sequence when starting up the A/D conversion circuit 10 of the invention. Firstly, an initial setting of the bias current indication value Bcont (n), which is the input signal of the bias current generator circuit 3, is carried out. In the case of the input-output characteristics of the bias current generator circuit 3 shown in FIG. 7, by setting Bcont(n) (when of 4 bits)=<1111> as an initial value, the A/D conversion time will be shortest. It is sufficient that the shortest A/D conversion time is stipulated by a minimum switching cycle Ts (a maximum frequency of the switching clock CLK-SW) stipulated by the specifications of the switching power supply circuit.

In the synchronization sequence shown in FIG. 12, in the case of A Bcont <1111>, which is the initial value, as the time until the delay line clock CLK-DL rises is shorter than the switching clock CLK-SW cycle, the output of the comparison flip-flop CompDFF of the phase difference detector circuit 2 shown in FIG. 6, which detects (latches) the level of the switching clock CLK-SW at the rising edge of the delay line clock CLK-DL, is at the L level (even when using the shortest A/D conversion time, the various kinds of delay time and a switching clock CLK-SW H time (a time when it is at the H level), and the like, are set as though the switching clock CLK-SW is decaying before the delay line clock CLK-DL rises), and the delay line clock CLK-DL is delayed by sequentially decrementing the Bcont(n), as shown in B to D. Then, the synchronization sequence is completed at a timing of E Bcont <1000>, at which the H level of the switching clock CLK-SW is detected at the rise of the delay line clock CLK-DL. By means of this sequence, the A/D conversion cycle is synchronized with the switching cycle Ts.

As heretofore described, according to the digital control switching power supply unit of the invention, as it operates in such a way that the A/D conversion cycle is synchronized with the switching cycle Ts, it is unnecessary to secure a temporal margin even in the event of a frequency variation accompanying a process fluctuation, variably setting the frequency, or the like, an optimum A/D conversion time is realized with a simple circuit configuration and control method, and transient response characteristics are improved.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A pulse width modulation (PWM) signal generation circuit for generating a PWM signal to control a switching power supply unit according to a switching cycle thereof, the PWM circuit comprising:

an analog-to-digital converter (ADC), operating during a conversion cycle, to generate a digital error signal by comparing, during a present switching cycle, a reference voltage with an input voltage that was obtained during a previous switching cycle, generating a delay output current indicative of a desired delay in generation of the error signal, the desired delay being based on a result of the comparison and based on a phase difference between the previous switching cycle and a previous conversion cycle, and converting the delay output current, after a conversion time delay equal to the desired delay, to the digital error signal, the present conversion cycle ending after the error signal is generated, the ADC including a detector for detecting said phase difference and outputting an indication value indicating said phase difference; and a delay circuit for generating the error signal with the conversion time delay according to the delay output current, the delay circuit further determining the duration of the present conversion cycle according to a delay reference current that is generated based on the reference voltage and said phase difference, the delay circuit including a delay element array having a plurality of delay elements connected in series, the delay output current flowing through the delay elements and controlling a signal transmission time of each delay element of the array to define said conversion time delay, the array converting an analog value of the delay output current to the error signal;

a circuit for performing a proportional integral and differential (PID) process on the error, and generating a duty command signal that controls a duty cycle of the PWM signal; and a circuit for generating the PWM signal based on the duty command signal.

2. The PWM signal generation circuit according to claim 1, wherein the delay circuit generates a storing timing signal indicating that the conversion of the delay output current has ended, based on the delay reference current, and the delay circuit further includes a circuit for storing a digital value of the delay output current upon receiving the storing timing signal, and an encoder for encoding the stored digital value into the error signal.

3. The PWM signal generation circuit according to claim 1, wherein the delay element array includes:
- a first array including a plurality of delay elements connected in series, through which the delay output current flows to control a signal transmission time of each delay element of the first array to define said conversion time delay, and
- a second array including another plurality of delay elements connected in series, through which the delay reference current flows to control a signal transmission time of each delay element of the second array to generate a timing signal indicating that the present conversion cycle has ended.

4. The PWM signal generation circuit according to claim 1, wherein each of the delay elements includes:
- a first-stage inverter including a first P-channel MOSFET and a first N-channel MOSFET, whose gates and drains are commonly connected, the first-stage inverter being connected between a power supply potential at a source of the first P-channel MOSFET and a reference potential at a body portion of the first N-channel MOSFET,
- a second-stage inverter including a second P-channel MOSFET and a second N-channel MOSFET, whose gates and drains are commonly connected, the second-stage inverter being connected with the power supply potential at a source of the second P-channel MOSFET, and
- a control MOSFET, responsive to an input voltage applied to a gate thereof, for controlling a current flowing therethrough, the control MOSFET being connected at drain and source thereof respectively with a source of the first N-channel MOSFET and a source of the second N-channel MOSFET.

5. The PWM signal generation circuit according to claim 1, the ADC further comprising:
- a bias current generator for generating a bias current according to the indication value outputted from said phase difference detector; and
- a means for generating the delay output current based on the bias current and a result of a comparison between the input voltage and the reference voltage, and generating the delay reference current based on the bias current and on the reference voltage, wherein the phase difference detector includes
- a flip-flop circuit for performing a comparison of the lengths of the previous switching cycle and the previous conversion cycle, and
- a control logic for incrementing or decrementing the indication value as a digital signal, according to an output of the flip-flop circuit.

6. The PWM signal generation circuit according to claim 5, wherein the bias current generator includes a digital-to-analog converter that generates a constant current as the bias current according to the indication value.

7. The PWM signal generation circuit according to claim 5, wherein the means for generating the delay output current upon receiving the bias current, includes
- a delay output current circuit, receiving the input voltage and the reference voltage as a pair of first differential inputs and outputting the delay output current; and
- a delay reference current circuit, receiving the reference voltage as both of a pair of second differential inputs and outputting the delay reference current,
- wherein the delay output and reference current circuits respectively include two parallelly-connected pairs of serially connected PMOS and NMOS devices, the first differential inputs are respectively connected to one and the other of the two PMOSs of the delay output current circuit, and the second differential inputs are respectively connected to one and the other of the two PMOSs of the delay reference current circuit.

8. A digital control switching power supply unit for converting an input voltage into a desired output voltage using a digitally controlled pulse width modulation (PWM) signal according to a switching cycle of the PWM signal, the power supply unit comprising:
- an analog-to-digital converter (ADC operating during a present conversion cycle, to generate a digital error signal by
  - comparing, during a present switching cycle, a reference voltage with an output voltage that was obtained during a previous switching cycle,
  - generating a delay output current indicative of a desired delay in generation of the delay output current, the desired delay being based on a result of the comparison and based on a phase difference between the previous switching cycle and a previous conversion cycle, and
  - converting the delay output current, after a conversion time delay equal to the desired delay to generate a digital error signal, the present conversion cycle ending after the error signal is generated, the ADC including
    - a detector for detecting said phase difference and outputting an indication value indicating said phase difference; and
    - a delay circuit for generating the error signal with the conversion time delay according to the delay output current, the delay circuit further determining the duration of the present conversion cycle according to a delay reference current that is generated based on the reference voltage and said phase difference, the delay circuit including a delay element array having a plurality of delay elements connected in series, the delay output current flowing through the delay elements and controlling a signal transmission time of each delay element of the array to define said conversion time delay, the array converting an analog value of the delay output current to the error signal;
- a circuit for performing a proportional integral and differential (PID) process on the error signal, and generating a duty command signal that controls a duty cycle of the PWM signal;
- a circuit for generating the PWM signal based on the duty command signal;
- a switching circuit for outputting a switching output voltage according to the PWM signal; and
- a smoothing filter for smoothing the switching output voltage to obtain an analog voltage.

9. The digital control switching power supply unit according to claim 8, wherein the delay circuit generates a storing timing signal indicating that the conversion of the delay output current has ended, based on the delay reference current, and the delay circuit further includes
- a circuit for storing a digital value of the delay output current from the delay elements upon receiving the storing timing signal, and
- an encoder for encoding the stored digital value into the error signal.

10. The digital control switching power supply unit according to claim 8, wherein the delay element array includes:
- a first array including a plurality of delay elements connected in series, through which the delay output current flows to control a signal transmission time of each delay element of the first array to define said conversion time delay, and a second array including another plurality of delay elements connected in series, through which the delay reference current flows to control a signal transmission time of each delay element of the second array to generate a timing signal indicating that the present conversion cycle has ended.

11. The digital control switching power supply unit according to claim 8, wherein each of the delay elements includes:

a first-stage inverter including a first P-channel MOSFET and a first N-channel MOSFET, whose gates and drains are commonly connected, the first-stage inverter being connected between a power supply potential at a source of the first P-channel MOSFET and a reference potential at a body portion of the first N-channel MOSFET, a second-stage inverter including a second P-channel MOSFET and a second N-channel MOSFET, whose gates and drains are commonly connected, the second-stage inverter being connected with the power supply potential at a source of the second P-channel MOSFET, and a control MOSFET, responsive to an input voltage applied to a gate thereof, for controlling a current flowing therethrough, the control MOSFET being connected at drain and source thereof respectively with a source of the first N-channel MOSFET and a source of the second N-channel MOSFET.

12. The digital control switching power supply unit according to claim 8, further comprising:

a bias current generator for generating a bias current according to the indication value outputted from said phase difference detector; and means for generating the delay output current based on the bias current and a result of a comparison between the input voltage and the reference voltage, and generating the delay reference current based on the bias current and on the reference voltage, wherein the phase difference detector includes a flip-flop circuit for performing a comparison of the lengths of the previous switching cycle and the previous conversion cycle, and a control logic for incrementing or decrementing the indication value as a digital signal, according to an output of the flip-flop circuit.

13. The digital control switching power supply unit according to claim 12, wherein the bias current generator includes a digital-to-analog converter that generates a constant current as the bias current according to the indication value.

14. The digital control switching power supply unit according to claim 12, wherein the means for generating the delay output current, receiving the bias current, includes:

a delay output current circuit, receiving the input voltage and the reference voltage as a pair of first differential inputs, for outputting the delay output current, and a delay reference current circuit, receiving the reference voltage as both of a pair of second differential inputs, for outputting the delay reference current, wherein the delay output and reference current circuits respectively includes two parallelly-connected pairs of serially connected PMOS and NMOS, the first differential inputs are respectively connected to one and the other of the two PMOSs of the delay output current circuit, and the second differential inputs are respectively connected to one and the other of the two PMOSs of the delay reference current circuit.

15. An analog-to-digital converter (ADC) operating according to a conversion cycle for converting a delay output current to a digital signal with a desired conversion time delay such that the present conversion cycle is synchronized with a present external cycle, the ADC comprising:

a detector for detecting a phase difference between a previous external cycle and a previous conversion cycle, and outputting an indication value indicating said phase difference;

a generator for generating a bias current according to the indication value outputted from said phase difference detector;

means for comparing an input voltage of the previous external cycle with a reference voltage, generating a delay output current indicative of the desired conversion time delay in its conversion to the digital signal, based on a result of the comparison and on the bias current, and generating a delay reference current based on the bias current and on the reference voltage; and a delay circuit for generating the digital signal with the conversion time delay according to the delay output current, the delay circuit further determining the duration of the present conversion cycle according to the delay reference current, the delay circuit including a delay element array having a plurality of delay elements connected in series, the delay output current flowing through the delay elements and controlling a signal transmission time of each delay element of the array to define said conversion time delay, the array converting an analog value of the delay output current to the digital signal.

16. The analog-to-digital converter according to claim 15, wherein the delay circuit generates a storing timing signal indicating that the conversion of the delay output current has ended, based on the delay reference current, and the delay circuit further includes a circuit for storing a digital value of the delay output current upon receiving the storing timing signal, and an encoder for encoding the stored digital value into the digital signal.

17. The analog-to-digital converter according to claim 15, wherein the delay element array includes:

a first array including a plurality of delay elements connected in series, through which the delay output current flows to control a signal transmission time of each first delay element of the first array to define said conversion time delay, a second array including another plurality of delay elements connected in series, through which the delay reference current flows to control a signal transmission time of each delay element of the second array to generate a timing signal indicating that the present conversion cycle has ended.

18. The analog-to-digital converter according to claim 15, wherein each of the delay elements includes:

a first-stage inverter including a first P-channel MOSFET and a first N-channel MOSFET, whose gates and drains are commonly connected, the first-stage inverter being connected between a power supply potential at a source of the first P-channel MOSFET and a reference potential at a body portion of the first N-channel MOSFET, a second-stage inverter including a second P-channel MOSFET and a second N-channel MOSFET, whose gates and drains are commonly connected, the second-stage inverter being connected with the power supply potential at a source of the second P-channel MOSFET, and a control MOSFET, responsive to an input voltage applied to a gate thereof, for controlling a current flowing therethrough, the control MOSFET being connected at drain and source thereof respectively with a source of the first N-channel MOSFET and a source of the second N-channel MOSFET.

19. The analog-to-digital converter according to claim 15, wherein the bias current generator includes a digital-to-analog converter that generates a constant current as the bias current according to the indication value.

20. The analog-to-digital converter according to claim 15, wherein the phase difference detector includes:
   a flip-flop circuit for performing a comparison of the lengths of the previous external cycle and the previous conversion cycle; and
   a control logic for incrementing or decrementing the indication value as a digital signal, according to an output of the flip-flop circuit, and wherein the means for generating the delay output current upon receiving the bias current, includes
a delay output current circuit, receiving the input voltage and the reference voltage as a pair of first differential inputs, for outputting the delay output current, and
a delay reference current circuit, receiving the reference voltage as both of a pair of second differential inputs, for outputting the delay reference current,
wherein the delay output and reference current circuits respectively includes two parallely-connected pairs of serially connected PMOS and NMOS, the first differential inputs are respectively connected to one and the other of the two PMOSs of the delay output current circuit, and the second differential inputs are respectively connected to one and the other of the two PMOSs of the delay reference current circuit.

\* \* \* \* \*